(12) United States Patent
Li

(10) Patent No.: US 12,027,529 B2
(45) Date of Patent: Jul. 2, 2024

(54) ARRAY SUBSTRATE AND DISPLAY PANEL

(71) Applicant: TCL CHINA STAR OPTOELECTRONICS TECHNOLOGY CO., LTD., Guangdong (CN)

(72) Inventor: Guanbiao Li, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/623,594

(22) PCT Filed: Dec. 22, 2021

(86) PCT No.: PCT/CN2021/140458
§ 371 (c)(1),
(2) Date: Dec. 28, 2021

(87) PCT Pub. No.: WO2023/108754
PCT Pub. Date: Jun. 22, 2023

(65) Prior Publication Data
US 2024/0038769 A1 Feb. 1, 2024

(30) Foreign Application Priority Data
Dec. 17, 2021 (CN) .......................... 202111555031.X

(51) Int. Cl.
*H01L 27/12* (2006.01)
(52) U.S. Cl.
CPC ............................... *H01L 27/1237* (2013.01)

(58) Field of Classification Search
CPC ... H01L 27/1237; H01L 27/12; H01L 27/124; H01L 29/786; G09F 9/30
See application file for complete search history.

(56) References Cited

U.S. PATENT DOCUMENTS

| | | | |
|---|---|---|---|
| 4,924,279 A | 5/1990 | Shimbo | |
| 2006/0175609 A1 | 8/2006 | Chan | |

(Continued)

FOREIGN PATENT DOCUMENTS

| | | | |
|---|---|---|---|
| CN | 102842601 A | 12/2012 | |
| CN | 103022150 A | 4/2013 | |

(Continued)

OTHER PUBLICATIONS

International Search Report in International application No. PCT/CN2021/140458, dated Sep. 16, 2022.

(Continued)

*Primary Examiner* — Mohammed R Alam
(74) *Attorney, Agent, or Firm* — PV IP PC; Wei Te Chung; Zhigang Ma

(57) ABSTRACT

The present application provides an array substrate and a display panel. The array substrate includes a substrate, a first gate electrode, a first insulating layer, a first electrode, a second gate electrode, a first conductive channel, and a second electrode. The present application reduces a leakage current of the array substrate by using an orthographic projection of the first gate electrode on the substrate to overlap an orthographic projection of the first conductive channel on the substrate.

19 Claims, 3 Drawing Sheets

(56) References Cited

U.S. PATENT DOCUMENTS

2011/0303985 A1* 12/2011 Masuoka ................ H01L 21/84
                                                                                    257/E21.409
2013/0069149 A1* 3/2013 Masuoka .......... H01L 29/78642
                                                                                      438/270
2013/0161732 A1    6/2013 Hwang

FOREIGN PATENT DOCUMENTS

| CN | 104391412 A | 3/2015 |
| CN | 107221501 A | 9/2017 |
| CN | 111192884 A | 5/2020 |

OTHER PUBLICATIONS

Written Opinion of the International Search Authority in International application No. PCT/CN2021/140458, dated Sep. 16, 2022.

* cited by examiner

ARRAY SUBSTRATE AND DISPLAY PANEL

BACKGROUND OF INVENTION

Field of Invention

The present application relates to a field of display technology, and particularly to an array substrate and a display panel.

Description of Prior Art

In manufacturing processes of panels, a quality design of thin film transistor devices is particularly important. There is a technical scheme to change a horizontal channel structure formed by a source electrode and a drain electrode in a thin film transistor device into a vertical channel structure, and dispose a gate of the thin film transistor device and the vertical channel structure on a same horizontal plane. On the one hand, the above technical scheme is conducive to reducing an occupied area of the thin film transistor device on a substrate and improving a pixel opening rate; and on the other hand, the above technical scheme can increase a length of the vertical channel by controlling a length of the gate in a vertical direction, so as to improve a drive current of the thin film transistor device.

However, the above technical scheme has following technical defects: since the gate of the thin film transistor device and the vertical channel structure are designed on the same horizontal plane, an active layer will cling to a glass substrate, and in this situation, the active layer will be easily affected by backlight, resulting in a sharp increase in a leakage current of the thin film transistor device, and making it difficult to completely turn off the thin film transistor device.

SUMMARY OF INVENTION

The present application provides an array substrate and a display panel to solve a technical problem of a large leakage current of existing array substrates.

In a first aspect, the present application provides an array substrate, wherein the array substrate includes:
a substrate;
a first gate electrode, wherein the first gate electrode is disposed on the substrate;
a first insulating layer, wherein the first insulating layer is disposed on the first gate electrode, and the first insulating layer is provided with a first through-hole;
a first electrode, wherein the first electrode is disposed on the first insulating layer;
a second insulating layer, wherein the second insulating layer is disposed on the first insulating layer and covers the first electrode, the second insulating layer is provided with a second through-hole and a third through-hole, and the first through-hole is communicated with the second through-hole;
a second gate electrode, wherein the second gate electrode is disposed in the first through-hole and the second through-hole and connected to the first gate electrode;
a first conductive channel, wherein the first conductive channel is disposed in the third through-hole and connected to the first electrode; and
a second electrode, wherein the second electrode is disposed on the second insulating layer and connected to the first conductive channel,
wherein an orthograph projection of the first electrode on the substrate overlaps an orthograph projection of the first conductive channel on the substrate.

Alternatively, in some embodiments of the present application, the first gate electrode and the second gate electrode are disposed perpendicular to each other.

Alternatively, in some embodiments of the present application, wherein the array substrate further includes a first connecting electrode, the first conductive channel is provided with a fourth through-hole, the first connecting electrode is disposed in the fourth through-hole, and one end of the first connecting electrode is connected to the first electrode.

Alternatively, in some embodiments of the present application, wherein a first surface of the first electrode is bonded and connected to a first surface of the first conductive channel.

Alternatively, in some embodiments of the present application, wherein the array substrate further includes a second conductive channel, the second insulating layer is provided with a fifth through-hole, the second conductive channel is disposed in the fifth through-hole, the second conductive channel is connected to the first conductive channel, the second conductive channel is located between the first electrode and the second gate electrode, and the second conductive channel is insulated from the second gate electrode.

Alternatively, in some embodiments of the present application, wherein one end of the second conductive channel is connected to the first electrode.

Alternatively, in some embodiments of the present application, another end of the second conductive channel is connected to the second electrode.

Alternatively, in some embodiments of the present application, wherein the first conductive channel and the second conductive channel are stacked.

Alternatively, in some embodiments of the present application, wherein the array substrate further includes a second connecting electrode, the second connecting electrode is disposed on the first conductive channel, the second electrode is disposed on the second connecting electrode, and an orthograph projection of the second gate electrode on a layer extension direction overlaps an orthograph projection of the second connecting electrode on the layer extension direction.

Alternatively, in some embodiments of the present application, a first side of the second conductive channel is connected to a first side of the second connecting electrode.

Alternatively, in some embodiments of the present application, a second side of the second conductive channel is connected to a first side of the second electrode.

Alternatively, in some embodiments of the present application, the second electrode overlaps the second conductive channel.

Alternatively, in some embodiments of the present application, materials of the first conductive channel are oxide semiconductor materials, and materials of the first insulating layer and materials of the second insulating layer are inorganic insulating materials.

Alternatively, in some embodiments of the present application, materials of the second conductive channel are oxide semiconductor materials.

Accordingly, the present application also provides a display panel, wherein the display panel includes the array substrate and a pixel electrode, the pixel electrode is disposed on the second electrode, and the pixel electrode is connected to the second electrode.

Alternatively, in some embodiments of the present application, the display panel also include a passivating layer, wherein the passivating layer is located between the pixel electrode and the second electrode, and the pixel electrode is connected to the second electrode through a via hole on the passivating layer.

The present application further provides an array substrate, wherein the array substrate includes:
- a substrate;
- a first gate electrode, wherein the first gate electrode is disposed on the substrate;
- a first insulating layer, wherein the first insulating layer is disposed on the first gate electrode, and the first insulating layer is provided with a first through-hole;
- a first electrode, wherein the first electrode is disposed on the first insulating layer;
- a second insulating layer, wherein the second insulating layer is disposed on the first insulating layer and covers the first electrode, the second insulating layer is provided with a second through-hole and a third through-hole, and the first through-hole is communicated with the second through-hole;
- a second gate electrode, wherein the second gate electrode is disposed in the first through-hole and the second through-hole and connected to the first gate electrode;
- a first conductive channel, wherein the first conductive channel is disposed in the third through-hole and connected to the first electrode; and
- a second electrode, wherein the second electrode is disposed on the second insulating layer and connected to the first conductive channel,
- wherein an orthograph projection of the first electrode on the substrate overlaps an orthograph projection of the first conductive channel on the substrate; and
- the first electrode is a source electrode, and the second electrode is a drain electrode.

Alternatively, in some embodiments of the present application, the first gate electrode and the second gate electrode are disposed perpendicular to each other.

Alternatively, in some embodiments of the present application, wherein the array substrate further includes a first connecting electrode, the first conductive channel is provided with a fourth through-hole, the first connecting electrode is disposed in the fourth through-hole, and one end of the first connecting electrode is connected to the first electrode.

Alternatively, in some embodiments of the present application, wherein a first surface of the first electrode is bonded and connected to a first surface of the first conductive channel.

Alternatively, in some embodiments of the present application, wherein the array substrate further includes a second conductive channel, the second insulating layer is provided with a fifth through-hole, the second conductive channel is disposed in the fifth through-hole, the second conductive channel is connected to the first conductive channel, the second conductive channel is located between the first electrode and the second gate electrode, and the second conductive channel is insulated from the second gate electrode.

Alternatively, in some embodiments of the present application, wherein one end of the second conductive channel is connected to the first electrode.

Alternatively, in some embodiments of the present application, another end of the second conductive channel is connected to the second electrode.

Alternatively, in some embodiments of the present application, wherein the first conductive channel and the second conductive channel are stacked.

Alternatively, in some embodiments of the present application, wherein the array substrate further includes a second connecting electrode, the second connecting electrode is disposed on the first conductive channel, the second electrode is disposed on the second connecting electrode, and an orthograph projection of the second gate electrode on a layer extension direction overlaps an orthograph projection of the second connecting electrode on the layer extension direction.

Alternatively, in some embodiments of the present application, a first side of the second conductive channel is connected to a first side of the second connecting electrode.

Alternatively, in some embodiments of the present application, a second side of the second conductive channel is connected to a first side of the second electrode.

Alternatively, in some embodiments of the present application, the second electrode overlaps the second conductive channel.

Alternatively, in some embodiments of the present application, materials of the first conductive channel are oxide semiconductor materials, and materials of the first insulating layer and materials of the second insulating layer are inorganic insulating materials.

Alternatively, in some embodiments of the present application, materials of the second conductive channel are oxide semiconductor materials.

Accordingly, the present application also provides a display panel, wherein the display panel includes the array substrate and a pixel electrode, the pixel electrode is disposed on the second electrode, and the pixel electrode is connected to the second electrode.

Alternatively, in some embodiments of the present application, the display panel also include a passivating layer, wherein the passivating layer is located between the pixel electrode and the second electrode, and the pixel electrode is connected to the second electrode through a via hole on the passivating layer. The present application provides the array substrate and the display panel, wherein the array substrate includes: a substrate; a first gate electrode, wherein the first gate electrode is disposed on the substrate; a first insulating layer, wherein the first insulating layer is disposed on the first gate electrode, and the first insulating layer is provided with a first through-hole; a first electrode, wherein the first electrode is disposed on the first insulating layer; a second insulating layer, wherein the second insulating layer is disposed on the first insulating layer and covers the first electrode, the second insulating layer is provided with a second through-hole and a third through-hole, and the first through-hole is communicated with the second through-hole; a second gate electrode, wherein the second gate electrode is disposed in the first through-hole and the second through-hole and connected to the first gate electrode; a first conductive channel, wherein the first conductive channel is disposed in the third through-hole and connected to the first electrode; and a second electrode, wherein the second electrode is disposed on the second insulating layer and connected to the first conductive channel, wherein an orthograph projection of the first electrode on the substrate overlaps an orthograph projection of the first conductive channel on the substrate. In the present application, by using the orthographic projection of the first gate electrode on the substrate to overlap the orthographic projection of the first conductive channel on the substrate, in this situation, the first gate electrode can block backlight, so as to avoid an influence of the backlight on the first conductive channel and reduce the leakage current of the array substrate.

BRIEF DESCRIPTION OF DRAWINGS

In order to explain embodiments or technical solutions in prior arts clearly, the following will briefly introduce drawings needed to be used in description of the embodiments or the prior arts. The drawings in the following description are only some embodiments of the invention. For those skilled in the art, other drawings can also be obtained from these drawings without paying creative labor.

DETAILED DESCRIPTION OF EMBODIMENTS

Technical schemes in embodiments of the present application will be described clearly and completely below in combination with accompanying drawings in the embodiments of the present application. Obviously, the described embodiments are only part of the embodiments of the present application, not all of the embodiments. Based on the embodiments in the present application, all other embodiments obtained by those skilled in the art without creative work belong to a scope of protection of the present application.

In the descriptions of the present application, it should be understood that a azimuth or positional relationship indicated by terms "up", "down", "front", "back", "left", "right", "inside", "outside" is based on the azimuth or positional relationship shown in the attached drawings, only for the convenience of describing the present application and simplifying the descriptions, rather than indicating or implying that devices or elements must have a specific orientation, be constructed and operated in a specific orientation, it cannot be understood as a limitation of the present application. In addition, terms "first" and "second" are only used for descriptive purposes and cannot be understood as indicating or implying relative importance or implicitly indicating numbers of indicated technical features. Thus, the features defining "first" and "second" may explicitly or implicitly comprise one or more of the features. In the description of this application, "multiple" means two or more, unless otherwise expressly and specifically defined.

The application provides an array substrate and a display panel, which are described in detail below. It should be noted that an order of the descriptions of the following embodiments is not a limitation of a preferred order of the embodiments of the present application.

Figure 1:
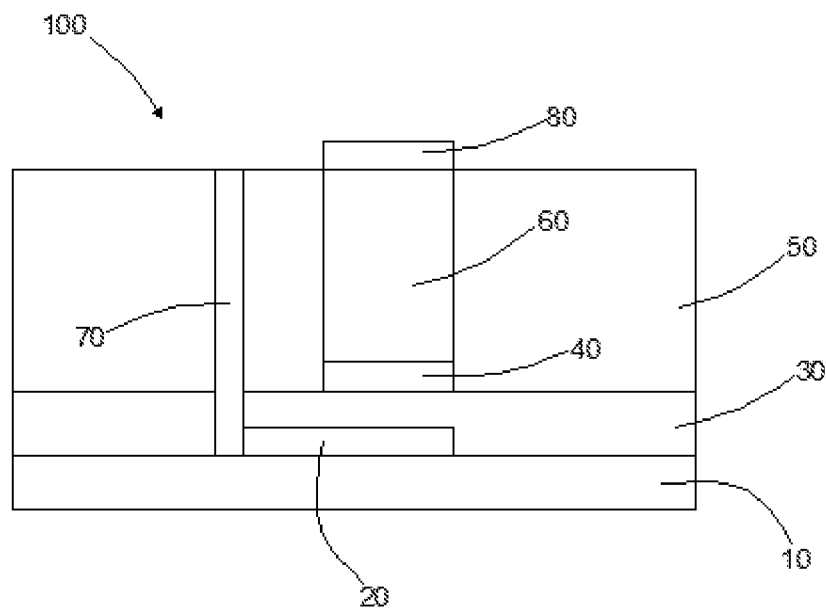
FIG. 1 is a first schematic structural diagram of an array substrate provided in the present application.

Referring to FIG. 1, FIG. 1 is a first schematic structural diagram of the array substrate provided in the present application. The present application provides the array substrate 100, wherein the array substrate 100 includes a substrate 10, a first gate electrode 20, a first insulating layer 30, a first electrode 40, a second insulating layer 50, a first conductive channel 60, a second gate electrode 70, and a second electrode 80.

Specifically, the first electrode 40 and the second electrode 80 in the above array substrate provided in the present application are equivalent to a source electrode or a drain electrode in the prior art. In specific implementations, the first electrode 40 can be used as the source electrode and the second electrode 80 can be used as the drain electrode, or the second electrode 80 can be used as the source electrode and the first electrode 40 can be used as the drain electrode, there are no restrictions here. That is, the first electrode 40 is the source electrode and the second electrode 80 is the drain electrode; or, the first electrode 40 is the drain electrode and the second electrode 80 is the source electrode.

The first gate electrode 20 is disposed on the substrate 10, wherein the first insulating layer 30 is disposed on the first gate electrode 20, the first insulating layer 30 is provided with a first through-hole, and the first electrode 40 is disposed on the first insulating layer 30; the second insulating layer 50 is disposed on the first insulating layer 30 and covers the first electrode 40, the second insulating layer 50 is provided with a second through-hole and a third through-hole, and the first through-hole is communicated with the second through-hole; and the second gate electrode 70 is disposed in the first through-hole and the second through-hole and connected to the first gate electrode 20.

The first conductive channel 60 is disposed in the third through-hole and connected to the first electrode 40; the second electrode 80 is disposed on the second insulating layer 50 and connected to the first conductive channel 60; and an orthographic projection of the first electrode 20 on the substrate 10 overlaps an orthographic projection of the first conductive channel 60 on the substrate 10.

By disposing an extension direction of the second gate electrode 70 to be same as an extension direction of the first conductive channel 60, a length of the second gate electrode 70 in a vertical direction can be controlled to increase a length of the first conductive channel 60, so as to improve a drive current of the array substrate. In addition, the present application also uses the orthographic projection of the first gate electrode 20 on the substrate 10 to overlap the orthographic projection of the first conductive channel 60 on the substrate 10, in this situation, the first gate electrode 20 can block backlight, so as to avoid an influence of the backlight on the first conductive channel 60 and reduce a leakage current of the array substrate 100.

In some embodiments, in order to improve a processing efficiency and reduce a material cost, the first gate electrode 20 and the second gate electrode 70 are disposed perpendicular to each other. Specifically, the first gate electrode 20 is disposed horizontally and the second gate electrode 70 is disposed vertically.

Figure 6:
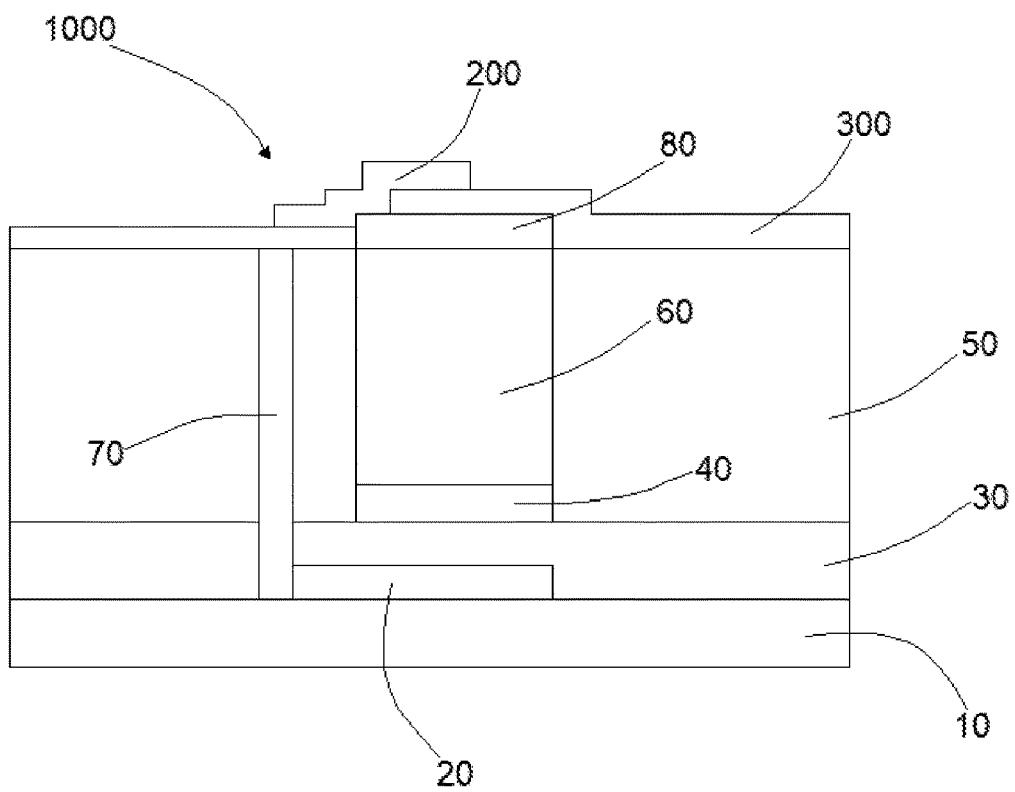
FIG. 6 is a schematic diagram of a display panel provided in the present application.

In addition, referring to FIG. 6, FIG. 6 is a schematic diagram of the display panel provided in the present application. The present application also provides the display panel 1000, which includes the array substrate 100 mentioned above. An implementation of the display panel can refer to an embodiment of the array substrate in the above embodiment, which will not be repeated here.

The display panel 1000 also includes a pixel electrode 200, wherein the pixel electrode 200 is disposed on the second electrode 80, and the pixel electrode 200 is connected to the second electrode 80.

In some embodiments, the display panel 1000 also includes a passivating layer 300, wherein the passivating layer 300 is located between the pixel electrode 200 and the second electrode 80, and the pixel electrode 200 is connected to the second electrode 80 through a via hole on the passivating layer 300.

Specifically, the array substrate provided in the present application can be applied to liquid crystal display panels, organic light-emitting diode (OLED) display devices, and other organic electroluminescent devices, which is not limited here.

Figure 2:
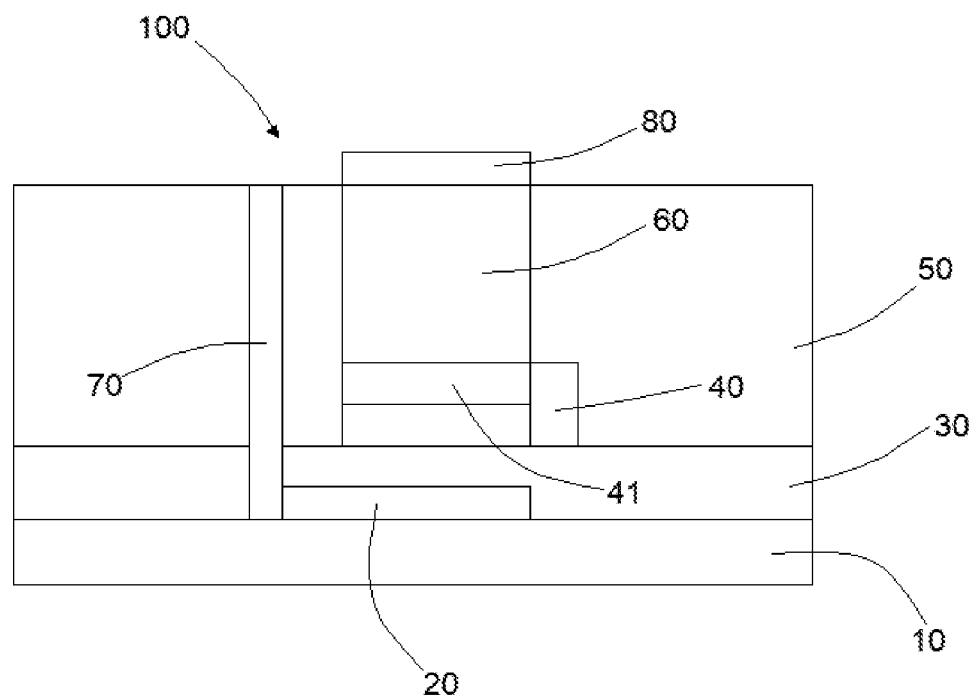
FIG. 2 is a second schematic structural diagram of the array substrate provided in the present application.

Referring to FIG. 2, FIG. 2 is a second schematic structural diagram of the array substrate provided in the present application. Differences between the present embodiment and the array substrate provided in FIG. 1 are that the array substrate 100 also includes a first connecting electrode 41, and the first conductive channel 60 is provided with a fourth through-hole, wherein the first connecting electrode 41 is disposed in the fourth through-hole, and one end of the first connecting electrode 41 is connected to the first electrode 40.

By providing the first connecting electrode 41, an overlap length of the second gate electrode 70, the first electrode 40 and the first connecting electrode 41 can be increased, so as to improve an on-state current of the array substrate 100.

In some embodiments, the orthographic projection of the first electrode 40 on the substrate 10 is staggered from the orthographic projection of the first gate electrode 20 on the substrate 10. In addition, the first connecting electrode 41 and the first electrode 40 are disposed perpendicular to each other.

In addition, in some embodiments, a first surface of the first electrode 40 is bonded and connected to a first surface of the first conductive channel 60, which can further increase a connection area between the conductive channel and the first electrode 40, so as to improve a connection stability between the conductive channel of the array substrate 100 and the first electrode 40.

Figure 3:
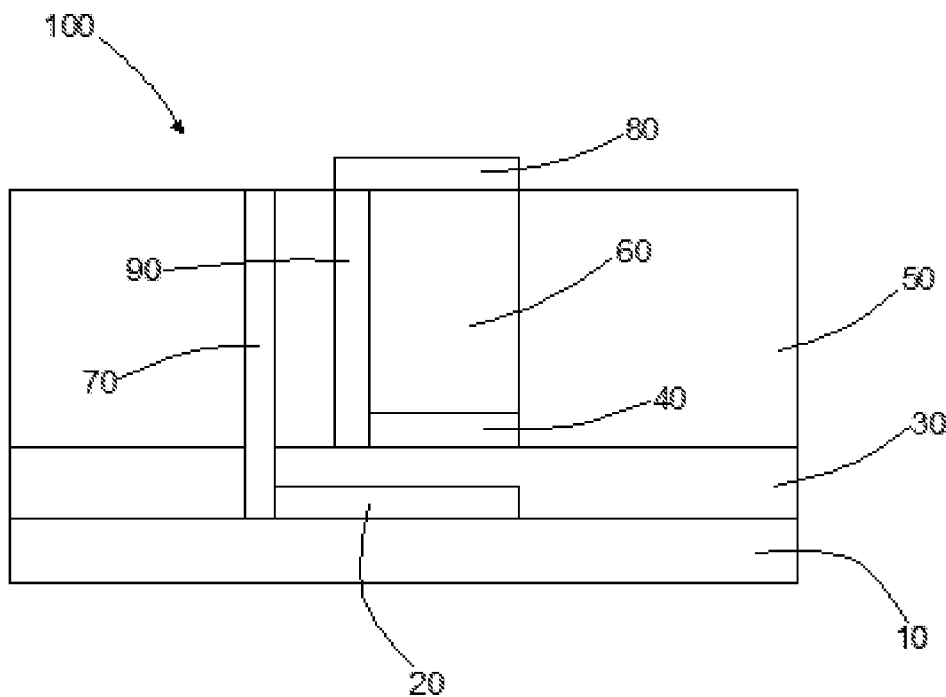
FIG. 3 is a third schematic structural diagram of the array substrate provided in the present application.

Referring to FIG. 3, FIG. 3 is a third schematic structural diagram of the array substrate provided in the present application. Differences between the present embodiment and the array substrate provided in FIG. 1 are that the array substrate also includes a second conductive channel 90, and the second insulating layer 50 is provided with a fifth through-hole, wherein the second conductive channel 90 is disposed in the fifth through-hole and connected to the first conductive channel 60, the second conductive channel 90 is located between the first electrode 40 and the second gate electrode 70, and the second conductive channel 90 is insulated from the second gate electrode 70.

By disposing the second conductive channel 90 between the first electrode 40 and the second gate electrode 70, an insulation effect between the first gate electrode 70 and the first electrode 40 can be strengthened, so as to avoid a short circuit between the second gate electrode 70 and the first electrode 40.

In some embodiments, one end of the second conductive channel 90 is connected to the first electrode 40. Specifically, a side of a lower end of the second conductive channel 90 is connected to the first electrode 40, which can further increase the connection area between the conductive channel and the first electrode 40, so as to improve the connection stability between the conductive channel of the array substrate 100 and the first electrode 40.

In some embodiments, another end of the second conductive channel 90 is connected to the second electrode 80. Specifically, an end face of an upper end of the second conductive channel 90 is connected to the second electrode 80, which can further increase a connection area between the conductive channel and the second electrode 80, so as to improve a connection stability between the conductive channel of the array substrate 100 and the second electrode 80.

In addition, in some embodiments, the first conductive channel 60 and the second conductive channel 90 are stacked in sequence. The stacked first conductive channel 60 and second conductive channel 90 can reduce space and maximize a contact area of the first conductive channel 60 and the second conductive channel 90.

Further, in specific implementations, the array substrate 100 provided in the present application can be an oxide array substrate, wherein materials of the first conductive channel 60 and the second conductive channel 90 of the array substrate 100 can be oxide semiconductor materials such as indium gallium zinc oxide, indium gallium tin oxide, indium zinc oxide, etc. Correspondingly, materials of the first insulating layer 30 and materials of the second insulating layer 50 of the array substrate can include inorganic insulating materials such as silica, silicon nitride, silicon oxynitride, alumina, and titanium oxide.

Of course, in specific implementations, the array substrate 100 provided in the present application can also be a low-temperature polycrystalline silicon array substrate, that is, the materials of the first conductive channel 60 and the materials of the second conductive channel 90 of the array substrate 100 can be amorphous silicon, polycrystalline silicon, or microcrystalline silicon materials. Correspondingly, the materials of the first insulating layer 30 and the materials of the second insulating layer 50 in the array substrate can be organic insulating materials such as resin insulating materials or acrylic insulating materials.

Figure 4:
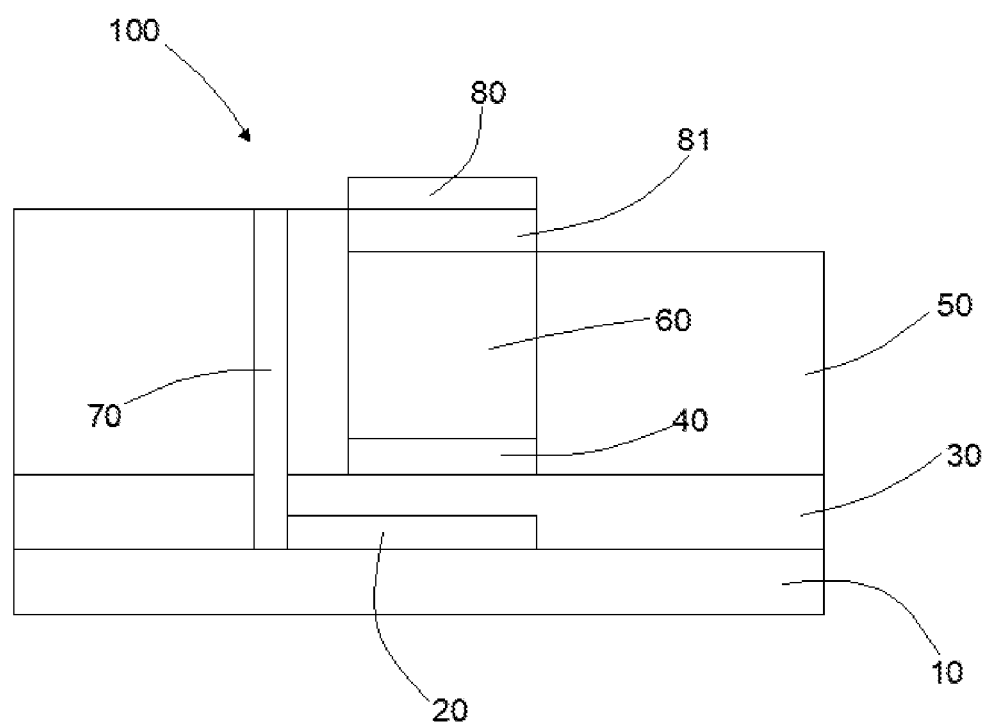
FIG. 4 is a fourth schematic structural diagram of the array substrate provided in the present application.

Referring to FIG. 4, FIG. 4 is a fourth schematic structural diagram of the array substrate provided in the present application. Differences between the present embodiment and the array substrate provided in FIG. 1 are that the array substrate 100 also includes a second connecting electrode 81, wherein the second connecting electrode 81 is disposed on the first conductive channel 60, the second electrode 80 is disposed on the second connecting electrode 81, and an orthographic projection of the second gate electrode 70 on a layer extension direction overlaps an orthographic projection of the second connecting electrode 81 on the layer extension direction.

By adding the second connecting electrode 81 and using the orthographic projection of the second gate electrode 70 on the layer extension direction to overlap the orthographic projection of the second connecting electrode 81 on the layer extension direction, an overlap length of the second gate electrode 70 and the second connecting electrode 81 can be increased, so as to improve the on-state current of the array substrate 100.

Figure 5:
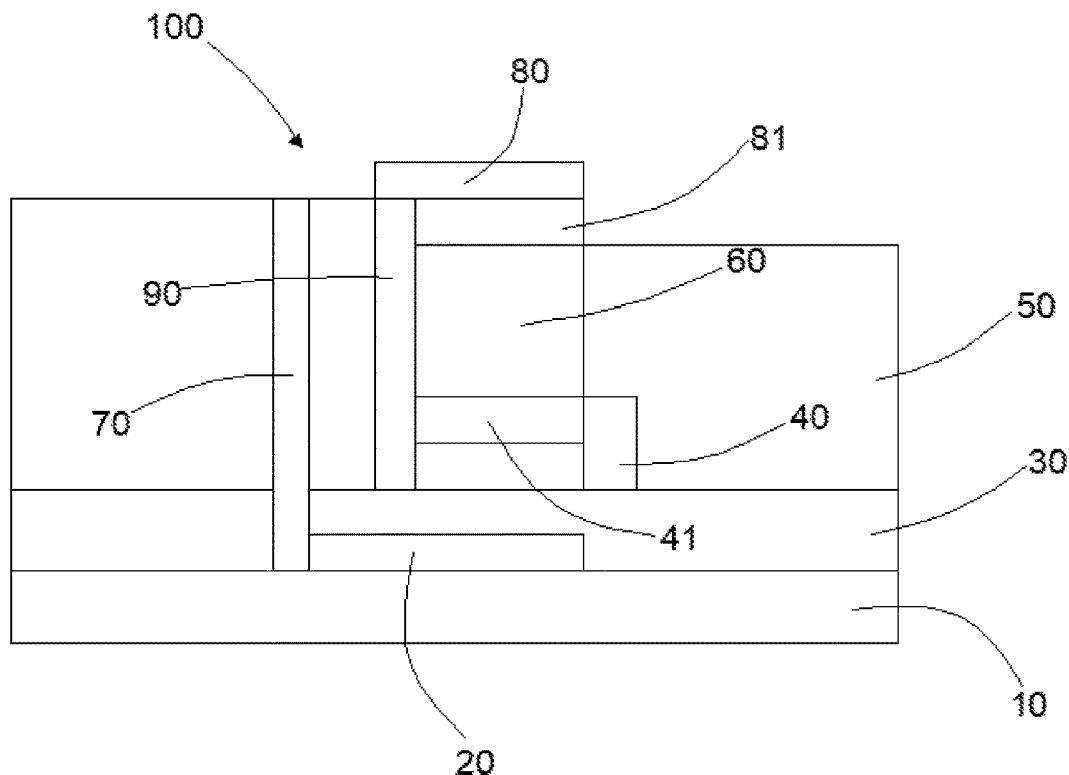
FIG. 5 is a fifth schematic structural diagram of the array substrate provided in the present application.

Referring to FIG. 5, FIG. 5 is a fifth schematic structural diagram of the array substrate provided in the present application. Differences between the present embodiment and the array substrate provided in FIG. 1 are that the array substrate 100 also includes the first connecting electrode 41, and the first conductive channel 60 is provided with the fourth through-hole, wherein the first connecting electrode 41 is disposed in the fourth through-hole, and one end of the first connecting electrode 41 is connected to the first electrode 40.

By providing the first connecting electrode 41, the overlap length of the second gate electrode 70, the first electrode 40 and the first connecting electrode 41 can be increased, so as to improve the on-state current of the array substrate 100.

Further, in some embodiments, the array substrate 100 also includes the second conductive channel 90, and the second insulating layer 50 is provided with the fifth through-hole, wherein the second conductive channel 90 is disposed in the fifth through-hole and connected to the first conductive channel 60, and the second conductive channel 90 is located between the first electrode 40 and the second gate electrode 70 and insulated from the second gate electrode 70.

By disposing the second conductive channel 90 between the first electrode 40 and the second gate electrode 70, the insulation effect between the second gate electrode 70 and the first electrode 40 can be strengthened, so as to avoid the short circuit between the second gate electrode 70 and the first electrode 40.

Further, the second conductive channel 90 is located between the first connecting electrode 41 and the second gate electrode 70.

In addition, in some embodiments, the first conductive channel 60 and the second conductive channel 90 are stacked in sequence. The stacked first conductive channel 60 and second conductive channel 90 can reduce the space and maximize the contact area of the first conductive channel 60 and second conductive channel 90.

Further, in some embodiments, one end of the second conductive channel 90 is connected to the first electrode 40. Specifically, another end of the first connecting electrode 41 is connected to one end of the second conductive channel 90, so as to realize a connection between one end of the second conductive channel 90 and the first electrode 40.

In addition, another end of the second conductive channel 90 is connected to the second electrode 80. Specifically, the end face of the upper end of the second conductive channel 90 is connected to the second electrode 80. Moreover, the first electrode 40 is connected to the first conductive channel 60 through the first connecting electrode 41, which can increase a connection area between the first electrode 40, the second electrode 80, and the conductive channel, so as to improve a connection stability between the electrode and the conductive channel.

In some embodiments, the orthographic projection of the first electrode 40 on the substrate 10 is staggered from the orthographic projection of the first gate electrode 20 on the substrate 10.

In addition, in some embodiments, the first surface of the first electrode 40 is bonded and connected to the first surface of the first conductive channel 60, which can further increase the connection area between the conductive channel and the first electrode 40, so as to improve the connection stability between the conductive channel of the array substrate 100 and the first electrode 40.

Further, the array substrate 100 also includes the second connecting electrode 81, wherein the second connecting electrode 81 is disposed on the first conductive channel 60, the second electrode 80 is disposed on the second connecting electrode 81, and the orthographic projection of the second gate electrode 70 on the layer extension direction overlaps the orthographic projection of the second connecting electrode 81 on the layer extension direction.

By adding the second connecting electrode 81 and using the orthographic projection of the second gate electrode 70 on the layer extension direction to overlap the orthographic projection of the second connecting electrode 81 on the layer extension direction, the overlap length of the second gate electrode 70 and the second connecting electrode 81 can be increased, so as to improve the on-state current of the array substrate 100.

In some embodiments, the first side of the second conductive channel 90 is connected to the first side of the second connecting electrode 71, and the second side of the second conductive channel 90 is connected to the first side of the second electrode 80, which can further increase the connection area between the conductive channel and the second electrode 80, so as to improve the connection stability between the conductive channel of the array substrate 100 and the second electrode 80. Wherein the first side and the second side of the second conductive channel 90 are adjacent and perpendicular to each other.

Moreover, the second electrode 80 covers the second conductive channel 90, which can avoid an exposure of the second conductive channel 90 and reduce a setting of an insulating layer.

The above describes the array substrate and the display panel provided in the embodiments of the present application in detail. In this paper, specific examples are applied to explain a principle and implementation modes of the present application. The descriptions of the above embodiments are only used to help understand a method and a core idea of the present application; meanwhile, for those skilled in the art, there will be changes in the specific implementation modes and an application scope according to the idea of the present application. In conclusion, contents of the specification should not be understood as restrictions on the present application.

What is claimed is:

1. An array substrate, comprising:
    a substrate;
    a first gate electrode, wherein the first gate electrode is disposed on the substrate;
    a first insulating layer, wherein the first insulating layer is disposed on the first gate electrode, and the first insulating layer is provided with a first through-hole;
    a first electrode, wherein the first electrode is disposed on the first insulating layer;
    a second insulating layer, wherein the second insulating layer is disposed on the first insulating layer and covers the first electrode, the second insulating layer is provided with a second through-hole and a third through-hole, and the first through-hole is communicated with the second through-hole;
    a second gate electrode, wherein the second gate electrode is disposed in the first through-hole and the second through-hole and connected to the first gate electrode;
    a first conductive channel, wherein the first conductive channel is disposed in the third through-hole and connected to the first electrode; and
    a second electrode, wherein the second electrode is disposed on the second insulating layer and connected to the first conductive channel,
    wherein an orthograph projection of the first electrode on the substrate overlaps an orthograph projection of the first conductive channel on the substrate.

2. The array substrate according to claim 1, wherein the array substrate further comprises a first connecting electrode, the first conductive channel is provided with a fourth through-hole, the first connecting electrode is disposed in the fourth through-hole, and one end of the first connecting electrode is connected to the first electrode.

3. The array substrate according to claim 2, wherein a first surface of the first electrode is bonded and connected to a first surface of the first conductive channel.

4. The array substrate according to claim 1, wherein the array substrate further comprises a second conductive channel, the second insulating layer is provided with a fifth through-hole, the second conductive channel is disposed in the fifth through-hole, the second conductive channel is connected to the first conductive channel, the second conductive channel is located between the first electrode and the second gate electrode, and the second conductive channel is insulated from the second gate electrode.

5. The array substrate according to claim 4, wherein one end of the second conductive channel is connected to the first electrode; and/or
another end of the second conductive channel is connected to the second electrode.

6. The array substrate according to claim 4, wherein the first conductive channel and the second conductive channel are stacked.

7. The array substrate according to claim 4, wherein the array substrate further comprises a second connecting electrode, the second connecting electrode is disposed on the first conductive channel, the second electrode is disposed on the second connecting electrode, and an orthograph projection of the second gate electrode on a layer extension direction overlaps an orthograph projection of the second connecting electrode on the layer extension direction.

8. The array substrate according to claim 7, wherein the second conductive channel is located between the second connecting electrode and the second gate electrode.

9. The array substrate according to claim 8, wherein the second electrode covers the second conductive channel.

10. A display panel, comprising an array substrate and a pixel electrode, wherein the pixel electrode is disposed on the second electrode, and the pixel electrode is connected to the second electrode,
wherein the array substrate comprises:
a substrate;
a first gate electrode, wherein the first gate electrode is disposed on the substrate;
a first insulating layer, wherein the first insulating layer is disposed on the first gate electrode, and the first insulating layer is provided with a first through-hole;
a first electrode, wherein the first electrode is disposed on the first insulating layer;
a second insulating layer, wherein the second insulating layer is disposed on the first insulating layer and covers the first electrode, the second insulating layer is provided with a second through-hole and a third through-hole, and the first through-hole is communicated with the second through-hole;
a second gate electrode, wherein the second gate electrode is disposed in the first through-hole and the second through-hole and connected to the first gate electrode;
a first conductive channel, wherein the first conductive channel is disposed in the third through-hole and connected to the first electrode; and
a second electrode, wherein the second electrode is disposed on the second insulating layer and connected to the first conductive channel; and
wherein an orthograph projection of the first electrode on the substrate overlaps an orthograph projection of the first conductive channel on the substrate.

11. An array substrate, comprising:
a substrate;
a first gate electrode, wherein the first gate electrode is disposed on the substrate;
a first insulating layer, wherein the first insulating layer is disposed on the first gate electrode, and the first insulating layer is provided with a first through-hole;
a first electrode, wherein the first electrode is disposed on the first insulating layer;
a second insulating layer, wherein the second insulating layer is disposed on the first insulating layer and covers the first electrode, the second insulating layer is provided with a second through-hole and a third through-hole, and the first through-hole is communicated with the second through-hole;
a second gate electrode, wherein the second gate electrode is disposed in the first through-hole and the second through-hole and connected to the first gate electrode;
a first conductive channel, wherein the first conductive channel is disposed in the third through-hole and connected to the first electrode; and
a second electrode, wherein the second electrode is disposed on the second insulating layer and connected to the first conductive channel,
wherein an orthograph projection of the first electrode on the substrate overlaps an orthograph projection of the first conductive channel on the substrate; and
the first electrode is a source electrode, and the second electrode is a drain electrode.

12. The array substrate according to claim 11, wherein the array substrate further comprises a first connecting electrode, the first conductive channel is provided with a fourth through-hole, the first connecting electrode is disposed in the fourth through-hole, and one end of the first connecting electrode is connected to the first electrode.

13. The array substrate according to claim 12, wherein a first surface of the first electrode is bonded and connected to a first surface of the first conductive channel.

14. The array substrate according to claim 11, wherein the array substrate further comprises a second conductive channel, the second insulating layer is provided with a fifth through-hole, the second conductive channel is disposed in the fifth through-hole, the second conductive channel is connected to the first conductive channel, the second conductive channel is located between the first electrode and the second gate electrode, and the second conductive channel is insulated from the second gate electrode.

15. The array substrate according to claim 14, wherein one end of the second conductive channel is connected to the first electrode; and/or
another end of the second conductive channel is connected to the second electrode.

16. The array substrate according to claim 14, wherein the first conductive channel and the second conductive channel are stacked.

17. The array substrate according to claim 14, wherein the array substrate further comprises a second connecting electrode, the second connecting electrode is disposed on the first conductive channel, the second electrode is disposed on the second connecting electrode, and an orthograph projection of the second gate electrode on a layer extension direction overlaps an orthograph projection of the second connecting electrode on the layer extension direction.

18. The array substrate according to claim 17, wherein the second conductive channel is located between the second connecting electrode and the second gate electrode.

19. The array substrate according to claim 18, wherein the second electrode covers the second conductive channel.

* * * * *